(12) United States Patent
Maegawa et al.

(10) Patent No.: US 8,067,804 B2
(45) Date of Patent: Nov. 29, 2011

(54) SEMICONDUCTOR DEVICE HAVING AN SOI STRUCTURE, MANUFACTURING METHOD THEREOF, AND MEMORY CIRCUIT

(75) Inventors: Shigeto Maegawa, Tokyo (JP); Takashi Ipposhi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 569 days.

(21) Appl. No.: 11/251,911

(22) Filed: Oct. 18, 2005

(65) Prior Publication Data

US 2006/0081930 A1     Apr. 20, 2006

(30) Foreign Application Priority Data

Oct. 18, 2004 (JP) ................... 2004-302463
Sep. 15, 2005 (JP) ................... 2005-268263

(51) Int. Cl.
*H01L 29/786* (2006.01)
(52) U.S. Cl. ........ 257/349; 257/288; 257/347; 257/348; 257/E29.278
(58) Field of Classification Search .......... 257/382–384, 257/348–349
See application file for complete search history.

(56) References Cited

U.S. PATENT DOCUMENTS 6,441,434 B1 * 8/2002 Long et al. .................... 257/347
6,455,894 B1 * 9/2002 Matsumoto et al. .......... 257/347
6,596,554 B2 * 7/2003 Unnikrishnan ............... 438/180
6,608,354 B2 * 8/2003 Hokazono et al. ............ 257/382
6,987,050 B2 * 1/2006 Cabral et al. .................. 438/301
7,256,463 B2 * 8/2007 Matsumoto et al. .......... 257/392

FOREIGN PATENT DOCUMENTS

JP      2003-197634      7/2003
JP      2003-332579     11/2003

OTHER PUBLICATIONS

Scholvin et al., "The Impact of Substrate Surface Potential on the Performance of RF Power LDMOSFETs on High-Resistivity SOI", IEEE 2003, (IEDM03, Tech. Digest).

* cited by examiner

*Primary Examiner* — Kenneth Parker
*Assistant Examiner* — Jose R Diaz
(74) *Attorney, Agent, or Firm* — McDermott Will & Emery LLP

(57) ABSTRACT

The present invention provides a semiconductor device capable of suppressing a body floating effect, and a manufacturing method thereof. A semiconductor device having an SOI structure includes a silicon substrate, a buried insulating layer formed on the silicon substrate, and a semiconductor layer formed on the buried insulating layer. The semiconductor layer has a body region of a first conduction type, a source region of a second conduction type and a drain region of the second conduction type, and a gate electrode is formed on the body region between the source region and the drain region via a gate oxide film. The source region includes an extension layer of the second conduction type, and a silicide layer which makes contact with the extension layer at its side face, and a crystal defect region is formed on a region of a depletion layer generated in a boundary portion between the silicide layer and the body region.

3 Claims, 13 Drawing Sheets

SEMICONDUCTOR DEVICE HAVING AN SOI STRUCTURE, MANUFACTURING METHOD THEREOF, AND MEMORY CIRCUIT

BACKGROUND OF THE INVENTION

1. Field of the Invention

The present invention relates to a semiconductor device, a manufacturing method thereof, and a memory circuit. In particular, the present invention relates to a semiconductor device having an SOI (Silicon On Insulator) structure, a manufacturing method thereof, and a memory circuit.

2. Description of the Background Art

In a MOS transistor having an SOI structure, conventionally, a buried oxide film is formed on a silicon substrate and a thin-film silicon layer is formed on the buried oxide film as a semiconductor layer. Then, a source region, a body region and a drain region are formed in the thin-film silicon layer. Further, a gate electrode is formed on the body region between the source region and the drain region via a gate insulating film. Thus, the MOS transistor is configured. Herein, when the body region is of a P type and the source region and the drain region are of an N type, the MOS transistor is of an N channel type.

In the MOS transistor having an SOI structure, the buried oxide film makes contact with the source region and the drain region in order to decrease parasitic capacitances of the source region and the drain region. Further, the thin-film silicon layer is removed from the periphery of the MOS transistor, and the periphery of the MOS transistor is covered with an element separation oxide film. Japanese Patent Application Laid-Open Nos. 2003-332579 and 2003-197634 disclose an invention concerning the aforementioned MOS transistor having an SOI structure.

In the conventional MOS transistor having an SOI structure, since the P-type body region is sandwiched between the N-type source region and the N-type drain region, PN junction is achieved in this portion. Besides, since the buried oxide film is provided on the bottom face of the body region, the potential of the body region is maintained at a floating state.

Consequently, the conventional MOS transistor having an SOI structure has serious problems in its operation such as a kink phenomenon of a drain current called a body floating effect, decrease of a source-drain withstand voltage, dependence of circuit operation time on operating frequency (history effect) and other phenomena.

SUMMARY OF THE INVENTION

The present invention relates to a semiconductor device, a manufacturing method thereof, and a memory circuit. In particular, an object of the present invention is to provide a semiconductor device having an SOI (Silicon On Insulator) structure, a manufacturing method thereof, and a memory circuit.

A semiconductor device according to the present invention is a semiconductor device having an SOI structure, including a silicon substrate, a buried insulating layer which is formed on the silicon substrate, and a semiconductor layer which is formed on the buried insulating layer. The semiconductor layer includes a body region of a first conduction type, a source region of a second conduction type and a drain region of the second conduction type, and a gate electrode is formed on the body region between the source region and the drain region via a gate oxide film. The source region includes an extension layer of the second conduction type, and a silicide layer which makes contact with the extension layer at its side face, and a crystal defect region is formed in a region of a depletion layer generated in a boundary portion between the silicide layer and the body region.

In the semiconductor device according to the present invention, the crystal defect region is formed in the region of the depletion layer generated in the boundary portion between the silicide layer and the body region. Consequently, leak current in reverse direction is increased, so that a body potential can be fixed at a source potential and a body floating effect can be suppressed.

A memory circuit according to the present invention includes an access transistor which is connected between a bit line and a storage node, a load transistor which is connected between a power supply and the storage node, and a driver transistor which is connected between a GND and the storage node. Each of the load transistor and the driver transistor has an SOI structure including a silicon substrate, a buried insulating layer which is formed on the silicon substrate, and a semiconductor layer which is formed on the buried insulating layer. The semiconductor layer includes a body region of a first conduction type, a source region of a second conduction type, and a drain region of the second conduction type, and a gate electrode is formed on the body region between the source region and the drain region via a gate oxide film. The source region includes an extension layer of the second conduction type, and a silicide layer which makes contact with the extension layer at its side face, and a crystal defect region is formed in a region of a depletion layer generated in a boundary portion between the silicide layer and the body region.

Since the memory circuit according to the present invention applies the structure of the semiconductor device of the present invention to the load transistor and the driver transistor, the body potentials at the load transistor and the driver transistor are fixed, and operations are stabilized when reading or writing data.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
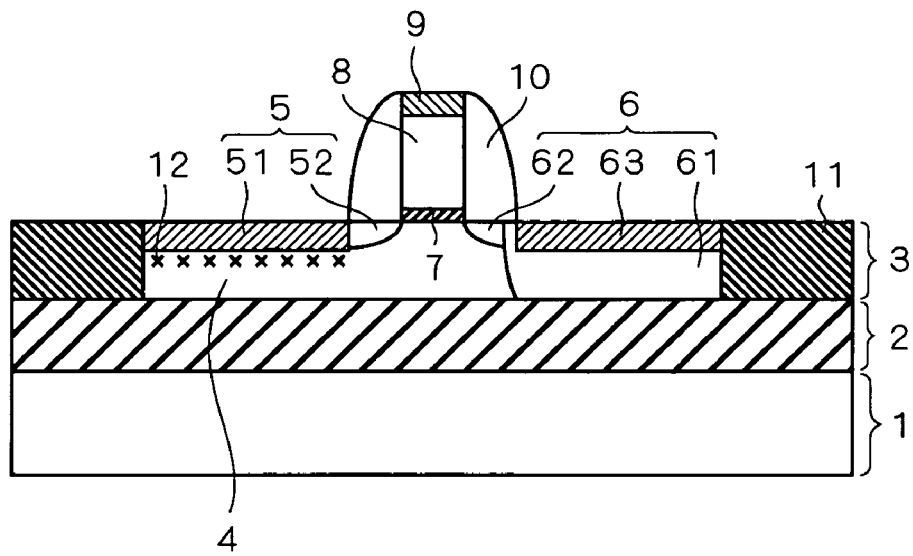
FIG. 1 is a sectional view of a semiconductor device according to a first embodiment of the present invention.

FIG. 1 is a sectional view of a semiconductor device according to a first embodiment. The semiconductor device shown in FIG. 1 has an SOI structure, in which a buried oxide film 2 is formed on a silicon substrate 1 and, further, a semiconductor layer 3 is formed on the buried oxide film 2. Since an N channel-type MOS transistor is formed in the semiconductor layer 3, a P-type body region 4, an N-type source region 5 and an N-type drain region 6 are provided.

The source region 5 includes a Co silicide layer 51 which makes contact with the body region 4 at its bottom face, and an N-type source extension layer 52 which makes contact with a side face of the Co silicide layer 51. The drain region 6 includes an N-type drain diffusion region 61 which makes contact with the buried oxide film 2, an N-type drain extension layer 62 which makes contact with a side face of the drain diffusion layer 61, and a Co silicide layer 63 which is formed so as to be buried into the N-type drain diffusion layer 61.

On the body region 4 between the source region 5 and drain region 6, a gate polysilicon 8 constituting a gate electrode is formed via a gate oxide film 7. The gate polysilicon 8 has a Co silicide layer 9 formed on its upper face, and a sidewall oxide film 10 formed at its side face. Further, the N channel-type MOS transistor shown in FIG. 1 is separated from other elements by an element separation oxide film 11.

In the semiconductor device shown in FIG. 1, the bottom face of the Co silicide layer 51 makes contact with the body region 4. The contact between the Co silicide layer 51 and the body region 4 is a Schottky junction, not ohmic contact, because the P-type impurity concentration of the body region 4 is usually thin about $10^{18}$ ions/cm$^3$. However, roughness is large at an interface between the Co silicide layer 51 and body region 4, and leak current at the Schottky junction is larger than leak current at ordinary PN junction. Besides, since a contact area of the Co silicide layer 51 and the body region 4 is relatively wide, the Co silicide layer 51 and the body region 4 are in electrically conductive state.

Since the Co silicide layer 51 and the source extension layer 52 are in ohmic contact, the body region 4 the Co silicide layer 51 and the source extension layer 52 are in electrically conductive state. Therefore, the potential of the body region 4 (body potential) is fixed at a source potential via resistances of the Co silicide layer 51 and the source extension layer 52.

Figure 2:
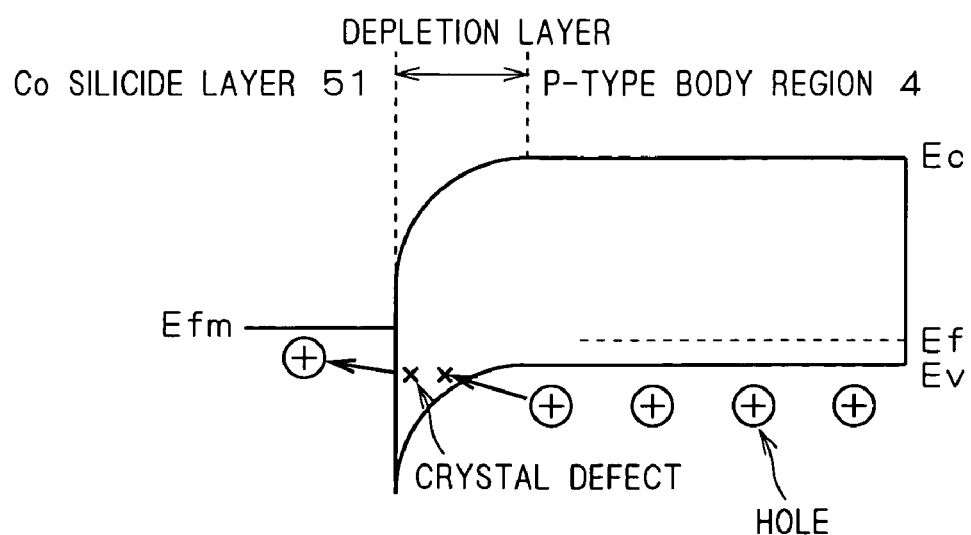
FIG. 2 is a potential diagram of the semiconductor device according to the first embodiment of the present invention.

In this embodiment, as shown in FIG. 1, a crystal defect layer 12 is further formed in a depletion layer generated in a boundary portion between the Co silicide layer 51 and the body region 4. By forming the crystal defect layer 12 in the depletion layer generated in the boundary portion between the Co silicide layer 51 and the body region 4, reverse direction leak current of Schottky junction can be increased. FIG. 2 is a potential diagram of the boundary portion between the Co silicide layer 51 and the body region 4. In FIG. 2, the depletion layer is formed on the body region 4 side of the boundary portion, and crystal defects of the crystal defect region 12 exist in this depletion layer portion. Holes of in a valance band flow into the Co silicide layer 51 via the crystal defects of the depletion layer; therefore, reverse direction leak current of Schottky junction is increased.

In FIG. 2, Ev represents an upper end potential in the valence band, and Ec represents a lower end potential in a conduction band. Further, Ef represents a Fermi level of the body region 4, and Efin represents a Fermi level of the Co silicide layer 51. By forming the crystal defects, the depletion layer is considered to contract to about several tens of nanometer or less.

In this embodiment, as described above, the body potential is fixed at a source potential via the resistances of the Co silicide layer 51 and the source extension layer 52. Further, by forming the crystal defect region 12, the contact resistance between the body potential and the source potential is lowered, and the time-course following performance of the body potential to the source potential is improved.

Figure 3:
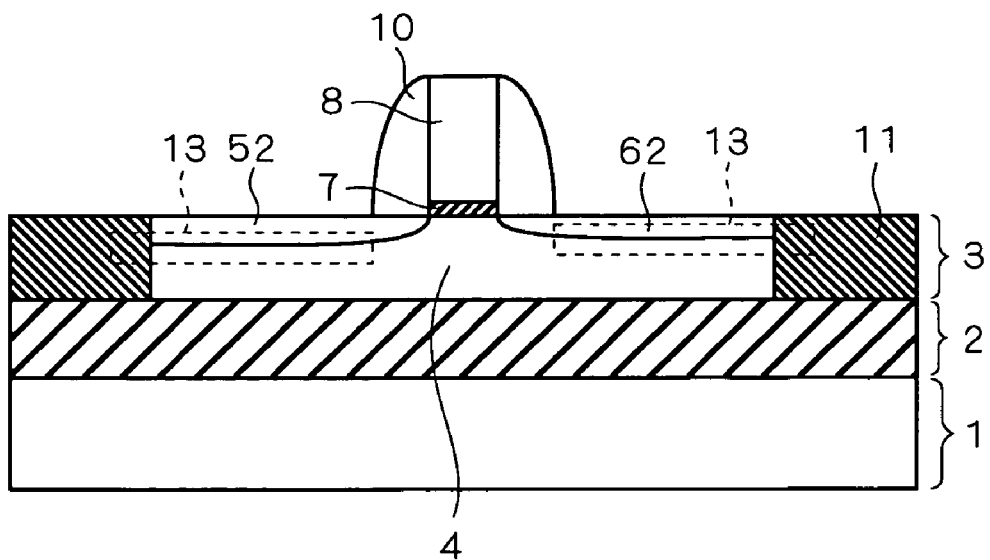
FIG. 3 is a sectional view of the semiconductor device according to the first embodiment of the present invention.

A manufacturing method of the semiconductor device according to this embodiment is described. FIG. 3 is a sectional view of the semiconductor device having only a source extension layer 52 in a source region 5, and only a drain extension region 62 in a drain region 6. The process until the semiconductor device shown in FIG. 3 is formed is schematically described below. First, a trench is formed in a semiconductor layer 3 of an SOI substrate, and an element separation oxide film 11 is formed. Next, by a heat oxidation method, a gate oxide film 7 is formed, and a gate polysilicon 8 is provided on the gate oxide film 7, so that a gate electrode is formed. As N-type impurities, arsenic ions are implanted in the semiconductor layer 3 by about $10^{14}$ ions/cm$^2$, so that a source extension layer 52 and a drain extension layer 62 are formed. A silicon oxide film is deposited on the semiconductor layer 3 and the silicon oxide film is anisotropically etched, so that a sidewall oxide film 10 is formed.

After forming the semiconductor device shown in FIG. 3, in this embodiment, a crystal defect region 12 is formed. In the semiconductor device shown in FIG. 3, by implanting about $10^{14}$ ions/cm$^2$ of silicon ions in a crystal defect formation region 13 indicated by a broken line, the crystallinity of the region is destructed, or many crystal defects are formed. Ions to be implanted are not limited to silicon, but others may be used as far as a band structure is changed and reverse direction leak current is increased by destructing the crystallinity or forming many crystal defects. Examples thereof may include germanium, nitrogen, oxygen, aluminum, and iron.

By implantation of silicon ions, crystal defects are formed not only in the source region but also in the drain region as shown in FIG. 3. However, as shown in FIG. 1, in this embodiment, since the drain diffusion layer 61 is formed up to the buried oxide film 2, crystal defects formed in the drain region are completely covered. As a result, increase of reverse direction leak current does not occur in the PN junction formed in the drain region.

Figure 4:
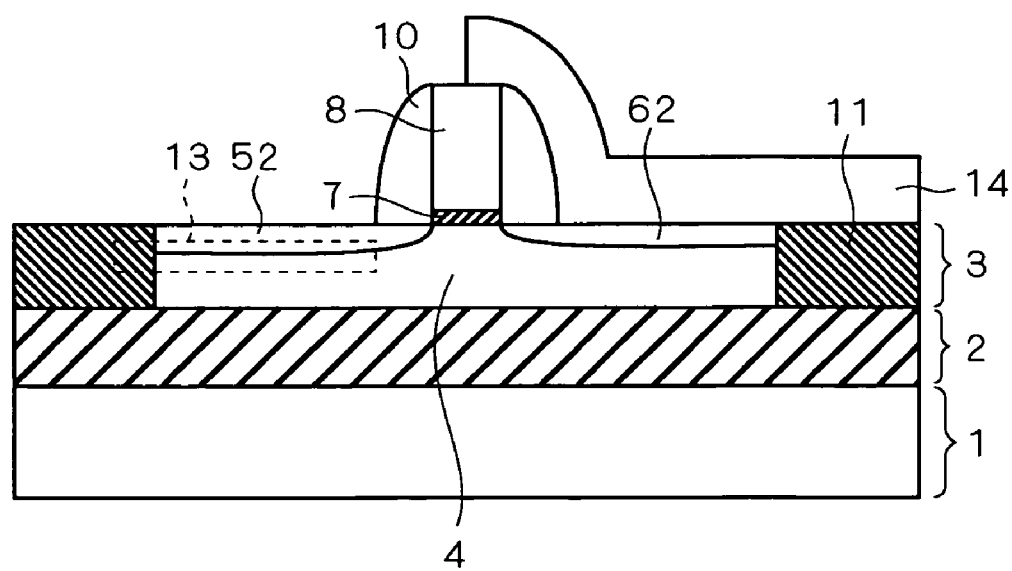
FIG. 4 is a sectional view of the semiconductor device according to the first embodiment of the present invention.

Alternatively, as in the semiconductor device shown in FIG. 4, in order that silicon ions may not be implanted in the drain region, a photoresist 14 may be formed only in the drain region with the use of photolithography. That is, by adding a step of forming the photoresist 14 before the step of implanting silicon ions, the crystal defect layer 12 can be formed only in the source region.

Figure 5:
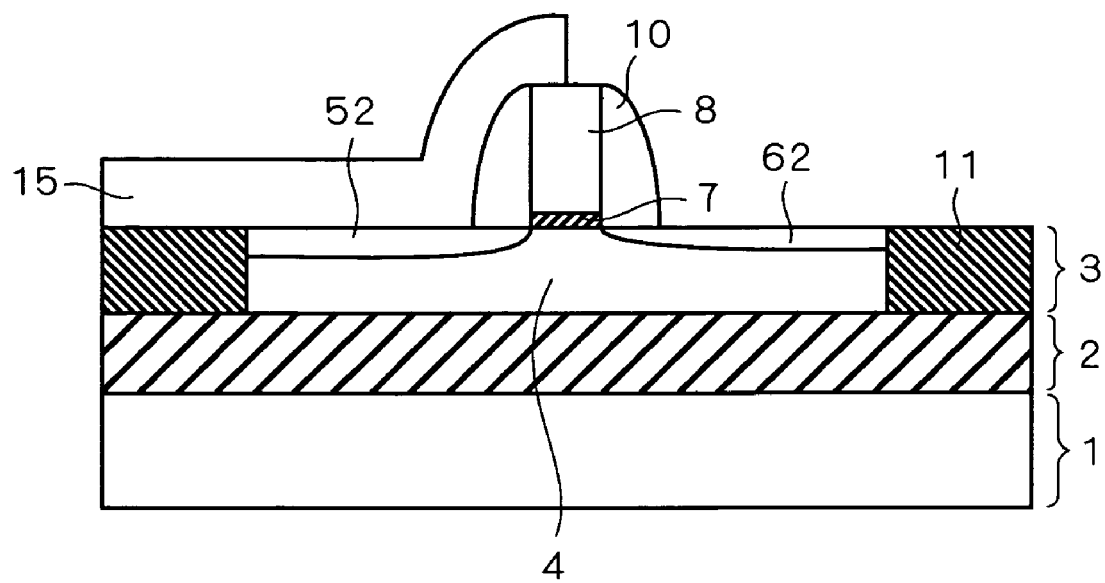
FIG. 5 is a sectional view of the semiconductor device according to the first embodiment of the present invention.

Specifically, a manufacturing method for forming the drain diffusion layer 61 is described with reference to FIG. 5. First, with the use of photolithography, a photoresist 15 is formed only on the source region. FIG. 5 shows that the photoresist 15 is formed only on the left side of the middle of the gate electrode. Using this photoresist 15 as a mask, arsenic ions are implanted only in the drain region by an ion implantation method. Arsenic ions to be implanted are about $10^{15}$ ions/$cm^2$. After implantation, the photoresist 15 is removed, and the semiconductor device is heated and annealed at about 1000° C., so that a deep drain diffusion layer 61 reaching the buried oxide film 2 can be formed.

Next, by depositing and annealing a Co film on the semiconductor layer 3, a Co silicide layer 51 is formed on the source region and a Co silicide layer 63 is formed on the drain region. Herein, the Co silicide layer 51 is formed deeper than the source extension layer 52, and a boundary of the Co silicide layer 51 and the body region 4 is positioned at the crystal defect formation region 13 shown in FIG. 3. As a result, PN junction is established between the Co silicide layer 51 and the body region 4, and the crystal defect layer 12 is formed in a depletion layer generated in the boundary of Co silicide layer 51 and body region 4, so that the reverse direction leak current of the PN junction is increased.

Thus, in the semiconductor device according to this embodiment, since the crystal defect layer 12 is formed in the depletion layer generated in the boundary of the Co silicide layer 51 and the body region 4, the semiconductor device according to this embodiment can fix the body potential at the source potential, and the body floating effect can be suppressed. Further, in the semiconductor device according to this embodiment, since the reverse direction leak current flowing between the Co silicide layer 51 and the body region 4 is increased, the following performance of the body potential to the source potential is improved. In this embodiment, the Co silicide layers 9, 51 and 63 are formed, but not limited to thereto in the present invention. Ni silicide layers, and other silicide layers than Co material may be used.

Second Embodiment

In a semiconductor device having an SOI structure, a body floating effect can be suppressed also by decreasing generation of hot carriers. In order to decrease the generation of such hot carriers, it is enough to lessen an electric field in a drain region at a gate electrode side. That is, a source region is made in a source impurity structure which is low in parasitic resistance, and an asymmetrical source-drain structure is formed, so that the electric field in the drain region at the gate electrode side can be lessened. This structure is employed in a semiconductor device according to a second embodiment.

Specifically, the semiconductor device according to this embodiment is described. The structure of the semiconductor device according to this embodiment is basically same as the structure shown in FIG. 1. This embodiment is, however, different from the first embodiment in that the impurity concentration of the source extension layer 52 is different from impurity concentration of the drain extension layer 62. For example, the impurity concentration of the source extension layer 52 is about $10^{21}$ ions/$cm^3$, and the impurity concentration of the drain extension layer 62 is about $10^{20}$ ions/$cm^3$.

A manufacturing method of the semiconductor device according to this embodiment is described. Since a source extension layer 52 and a drain extension layer 62 are formed at the same time by implanting arsenic ions as N-type impurities into a semiconductor layer 3, the impurity concentration of the source extension layer 52 and the impurity concentration of the drain extension layer 62 are the same. In this embodiment, accordingly, a process shown in FIG. 6 is added in order to differ the impurity concentration of the source extension layer 52 with the impurity concentration of the drain extension layer 62.

Figure 6:
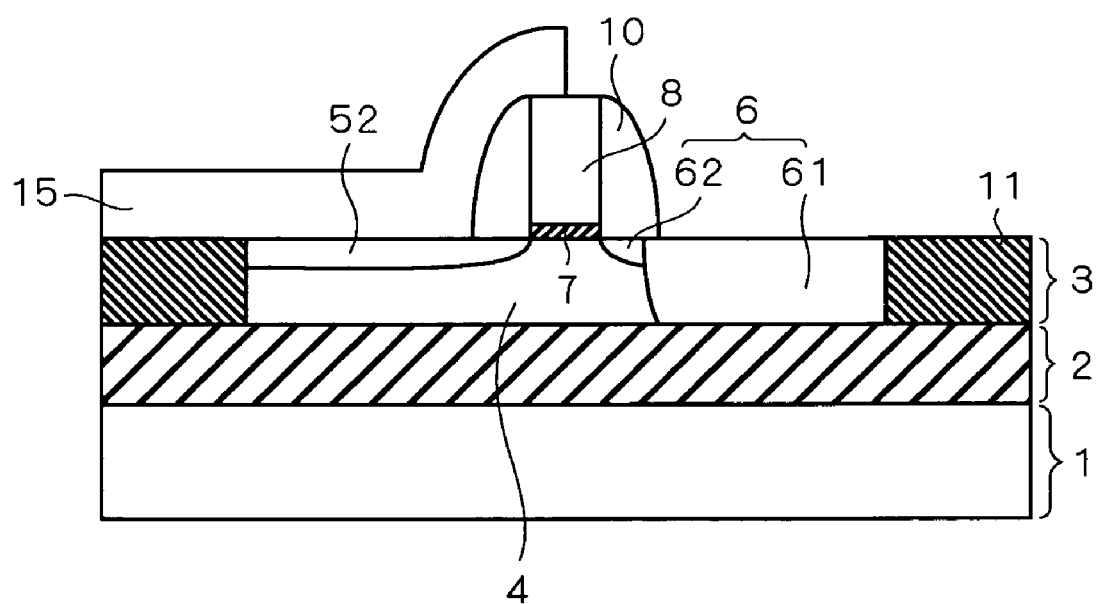
FIG. 6 is a sectional view of a semiconductor device according to a second embodiment of the present invention.

In the manufacturing process shown in FIG. 6, after the process of the first embodiment shown in FIG. 5, a process is added to implant P-type impurities (for example, boron) from an oblique direction in order to lower the effective impurity concentration of the drain extension layer 62 only. The P-type impurities to be implanted in the drain extension layer 62 is, for example, about $10^{19}$ ions/$cm^3$. Thus, in the semiconductor device shown in FIG. 6, by implanting the P-type impurities into the drain extension layer 62, N-type impurities (arsenic) of the drain extension layer 62 are compensated, and the effective impurity concentration is lowered, so that an electric field at a drain region end on a gate electrode side can be lowered.

Thus, in the semiconductor device according to this embodiment, by the source-drain structure asymmetrical in impurity concentration, the body floating effect by hot carrier can be suppressed, and transistor driving current can be improved by decreased parasitic resistance of the source region.

In this embodiment, by implanting P-type impurities in the drain extension layer 62, a source-drain structure of asymmetrical impurity concentration is formed; however, the present invention is not limited to this structure. By implanting N-type impurities in the source extension layer 52, a source-drain structure of asymmetrical impurity concentration can be formed. For example, by forming the source extension layer 52 and the drain extension layer 62 at impurity concentration of about $10^{20}$ ions/$cm^3$, in a subsequent process, arsenic ions are implanted only in the source extension layer 52, and the impurity concentration of the source extension layer 52 is set to about $10^{21}$ ions/$cm^3$.

Third Embodiment

Figure 7:
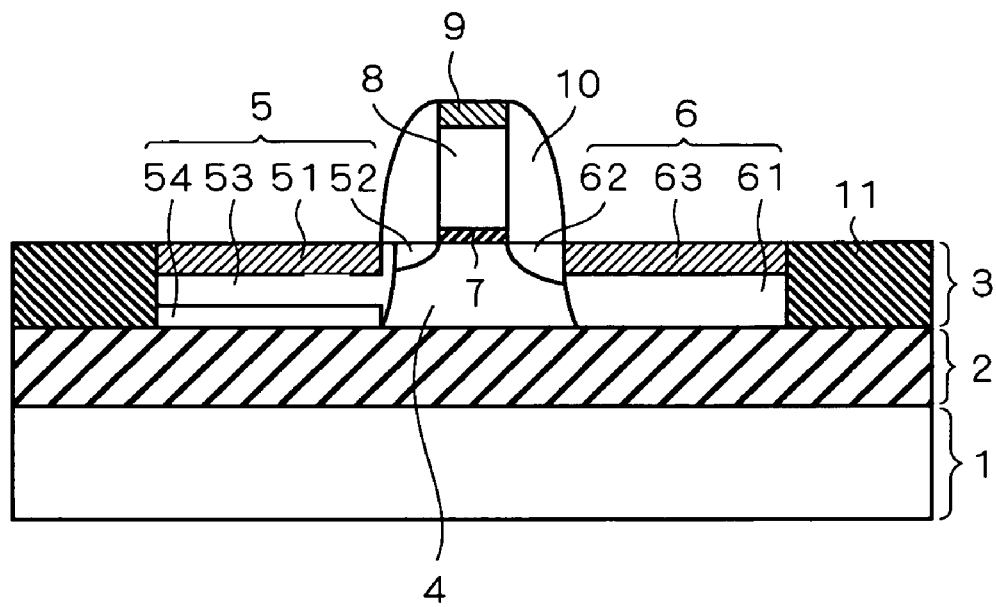
FIG. 7 is a sectional view of a semiconductor device according to a third embodiment of the present invention.

FIG. 7 is a sectional view of a semiconductor device according to a third embodiment. The semiconductor device in FIG. 7 differs from the structure of the source region 5 shown in FIG. 1. All other parts than the source region 5 in FIG. 7 are same as in the semiconductor device shown in FIG. 1, and same parts are denoted by the same reference numerals and detailed description will not be given herein.

The source region 5 shown in FIG. 7 includes a source extension layer 52 formed in the vicinity of a gate oxide film 7, a Co silicide layer 51 formed in a side direction of a source extension layer 52, an N-type source diffusion layer 53 formed under the Co silicide layer 51, and a P-type diffusion layer 54 formed under the source diffusion layer 53. The P-type diffusion layer 54 makes contact with the source diffusion layer 53 in a wider area as compared with the contact area of the source diffusion layer 53 and a body region 4. The P-type diffusion layer 54 is higher in impurity concentration than the body region 4.

In this case, since leak current flowing between the P-type diffusion layer 54 and the source diffusion layer 53 is increased from leak current flowing between the body region 4 and the source diffusion layer 53, a body potential can be fixed at a source potential. The reason for increase of the leak current is described specifically. First, generally, a depletion layer spreads at a junction interface between a P-type and an N-type due to junction diffusion potential difference. However, the depletion layer does not spread if the impurity concentration is high as in the case of a junction interface between the P-type diffusion layer 54 and the source diffusion layer 53, and an electric field becomes steep. As a result, at the junction interface between the P-type diffusion layer 54 and the source diffusion layer 53, the electric field is steep, tunnel current flows in a quantum manner, and leak current is increased by field induction. The higher the impurity concentration, the more the leak current increases; however, it should be at least $10^{18}$ ions/cm$^3$ or more.

Figure 8:
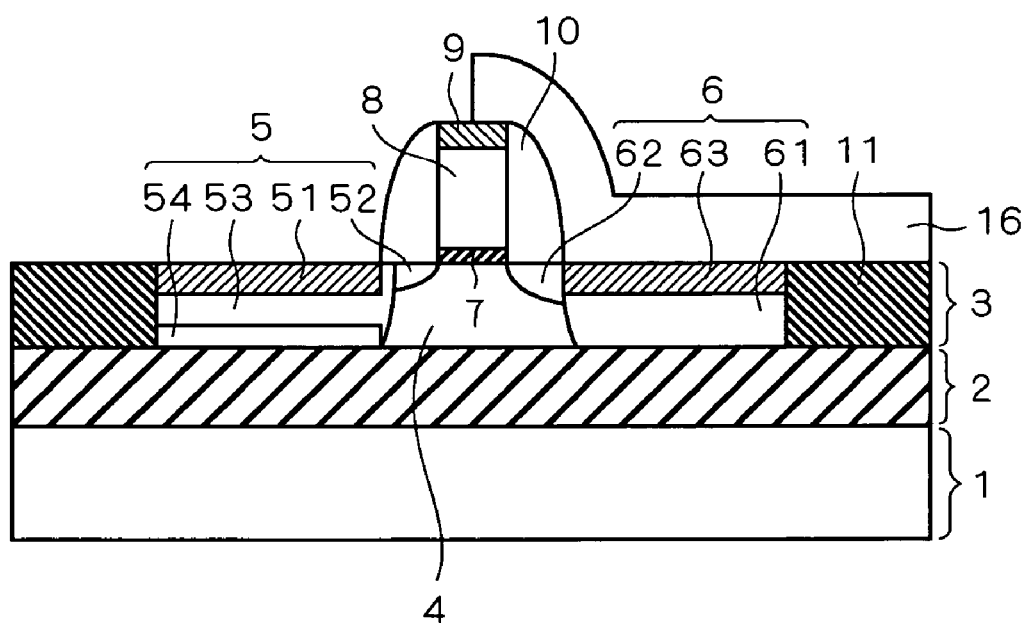
FIG. 8 is a sectional view of the semiconductor device according to the third embodiment of the present invention.

A manufacturing method of the P-type diffusion layer 54 shown in FIG. 7 is described. In the semiconductor device shown in FIG. 8, in order to form another source diffusion layer 53 and a drain diffusion layer 61 on the semiconductor device manufactured by the same manufacturing process as in the aforementioned embodiment, a photoresist 16 is formed only on a drain region 6 with the use of photolithography. In order to form the P-type diffusion layer 54, by using the photoresist 16 as a mask, boron ions are implanted by about $10^{15}$ ions/cm$^2$. The range of boron ions is in the vicinity of a buried oxide film 2 of the source region 5. As a result, the P-type diffusion layer 54 shown in FIG. 7 can be formed.

Thus, in the semiconductor device according to this embodiment, since the P-type diffusion layer 54 is provided, the body potential can be fixed at the source potential and the body floating effect can be suppressed. In the semiconductor device according to this embodiment, the asymmetrical source-drain structure described in the second embodiment may be also applied. In this embodiment, Co silicide layers 9, 51, 63 are formed, but not limited thereto in the present invention. Ni silicide layers and silicide layers of other material than Co may be also formed.

Fourth Embodiment

In the semiconductor device shown in FIG. 1, the bottom face of the source extension layer 52 makes contact only with the Co silicide layer 51. Accordingly, the source extension layer 52 makes contact only with the side face of the Co silicide layer 51, and the contact resistance of the source extension layer 52 and the Co silicide layer 51 become high. Therefore, this contact resistance becomes a parasitic resistance to a current path flowing from the Co silicide layer 51 to a channel inversion layer beneath the gate electrode via the source extension layer 52, which causes to lower the turn-on current of transistor.

Figure 9:
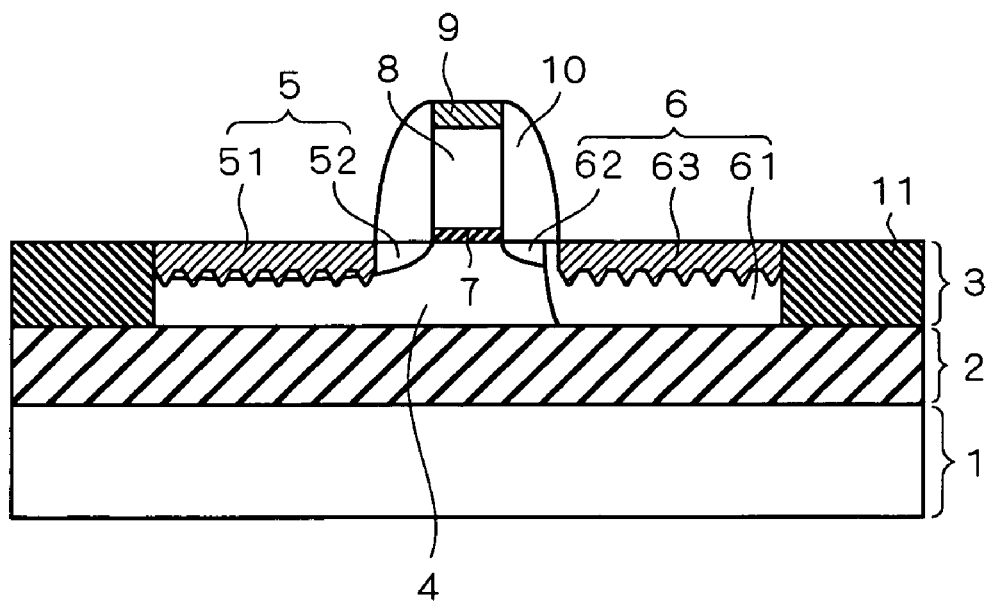
FIG. 9 is a sectional view of a semiconductor device according to a fourth embodiment of the present invention.

In a semiconductor device according to a fourth embodiment, a bottom face of a Co silicide layer 51 is a coexisting area of a region which makes contact with a source extension layer 52 and a region which makes contact with a body region 4, and therefore the bottom face of the Co silicide layer 51 has a region which makes contact with the source extension layer 52, so that the contact resistance is decreased between the Co silicide layer 51 and the source extension layer 52. FIG. 9 is a sectional view of the semiconductor device according to this embodiment. The semiconductor device shown in FIG. 9 is basically same as the semiconductor device shown in FIG. 1, except that the bottom face of the Co silicide layer 51 is different.

That is, in the semiconductor device shown in FIG. 1, the bottom face of the Co silicide layer 51 makes contact only with the body region 4, while in the semiconductor device shown in FIG. 9, the bottom face of the Co silicide layer 51 is the coexisting area of the region which makes contact with the source extension layer 52 and the region which makes contact with the body region 4. More specifically, the coexisting state is described. As shown in FIG. 9, the bottom face of the Co silicide layer 51 has an uneven shape. Accordingly, when the bottom face of the source extension layer 52 is positioned at the middle of uneven shape, protrusions of the Co silicide layer 51 make contact with the body region 4, and recesses thereof make contact with the source extension layer 52.

When a Co silicide layer 51 having a thickness of about 20 nm to 60 nm is formed, the amplitude of the uneven shape formed in the bottom face is about 5 nm to 10 nm. It is possible in a manufacturing technique to determine the depth of the source extension layer 52 so that the bottom face of the source extension layer 52 is positioned at the middle of the uneven shape of the Co silicide layer 51. A bottom face of a Co silicide layer 63 formed in a drain region 6 also has a similar uneven shape, but unlike the case of the source region 5, since a drain diffusion layer 61 is formed, the Co silicide layer 63 makes contact only with the drain diffusion layer 61.

Thus, in the semiconductor device according to this embodiment, since the bottom face of the Co silicide layer 51 is the coexisting area of the region which makes contact with the source extension layer 52 and the region which makes contact with the body region 4, the contact area of the Co silicide layer 51 and the source extension layer 52 is increased, and parasitic resistance to turn-on current of a transistor can be suppressed. In the semiconductor device according to this embodiment, further, since the Co silicide layer 51 also makes contact with the body region 4, the body potential can be fixed at the source potential, and the body floating effect can be suppressed.

In the semiconductor device according to this embodiment, the asymmetrical source-drain structure described in the second embodiment may be also applied. In this embodiment, Co silicide layers 9, 51, 63 are formed, but not limited thereto in the present invention. Ni silicide layers and silicide layers of other material than Co may be also formed.

Fifth Embodiment

Figure 10:
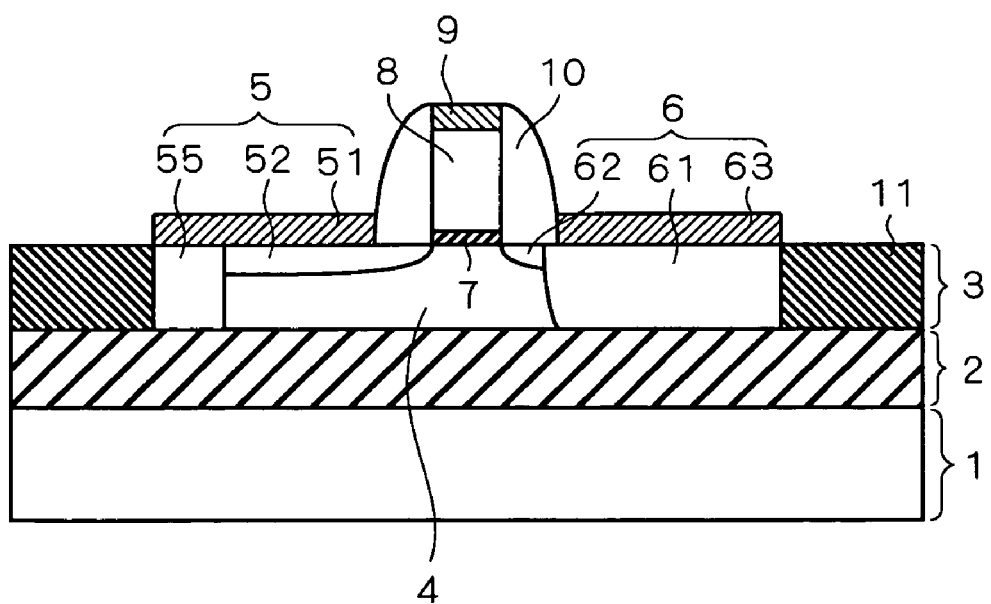
FIG. 10 is a sectional view of a semiconductor device according to a fifth embodiment of the present invention.

FIG. 10 is a sectional view of a semiconductor device according to a fifth embodiment. The semiconductor device according to this embodiment, same as in the fourth embodiment, has a configuration for suppressing contact resistance of a Co silicide layer 51 and a source extension layer 52. Specifically, in this embodiment, as shown in FIG. 10, the entirety or majority of the Co silicide layer 51 is formed on a semiconductor layer 3. In such configuration, the entire bottom face of the Co silicide layer 51 makes contact with the source extension layer 52, and the contact area is increased and contact resistance is decreased as compared with the configuration shown in FIG. 1, in which only the side face of the Co silicide layer 51 makes contact with the source extension layer 52.

In the semiconductor device shown in FIG. 10, however, since the Co silicide layer 51 does not make contact directly with a body region 4, in order to fix the body potential at the source potential, a P-type diffusion layer 55 must be provided for connecting the Co silicide layer 51 to the body region 4.

A manufacturing method of the semiconductor device according to this embodiment is described. Although not shown in the figure, first, a trench is provided on a semiconductor layer 3 having an SOI substrate, and an element separation oxide film 11 is formed. Next, a gate oxide film 7 is formed by a heat oxidation method, and a gate polysilicon 8 is provided on the gate oxide film 7, so that a gate electrode is formed. By implanting arsenic ions as N-type impurities in the semiconductor layer 3 by an ion implantation method, a source extension layer 52 and a drain extension layer 62 are formed. A silicon oxide film is deposited on the semiconductor layer 3, and the silicon oxide film is etched anisotropically, so that a sidewall oxide film 10 is formed.

Figure 11:
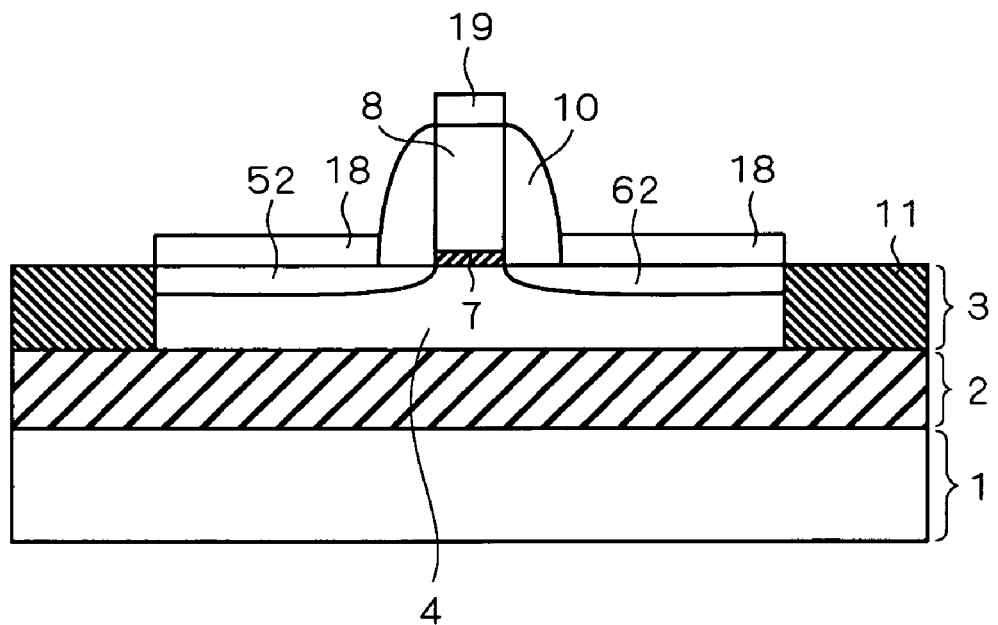
FIG. 11 is a sectional view of the semiconductor device according to the fifth embodiment of the present invention.

In this embodiment, by the technology of selective epitaxial growth, a single silicon crystal layer is grown on the semiconductor layer 3 of a source region 5 and a drain region 6, so that an epitaxial growth layer 18 is formed. FIG. 11 is a sectional view of the semiconductor device having the epitaxial growth layer 18 formed thereon. In the case of using the technology of selective epitaxial growth, a single crystal layer of silicon is not grown on an insulating film such as an oxide film, but a single crystal layer of silicon is grown on the gate polysilicon 9. Therefore, prior to the technology of selective epitaxial growth, a cap oxide film 19 is formed on the gate polysilicon 8, so that a single crystal layer of silicon may not be grown on the gate polysilicon 8.

Figure 12:
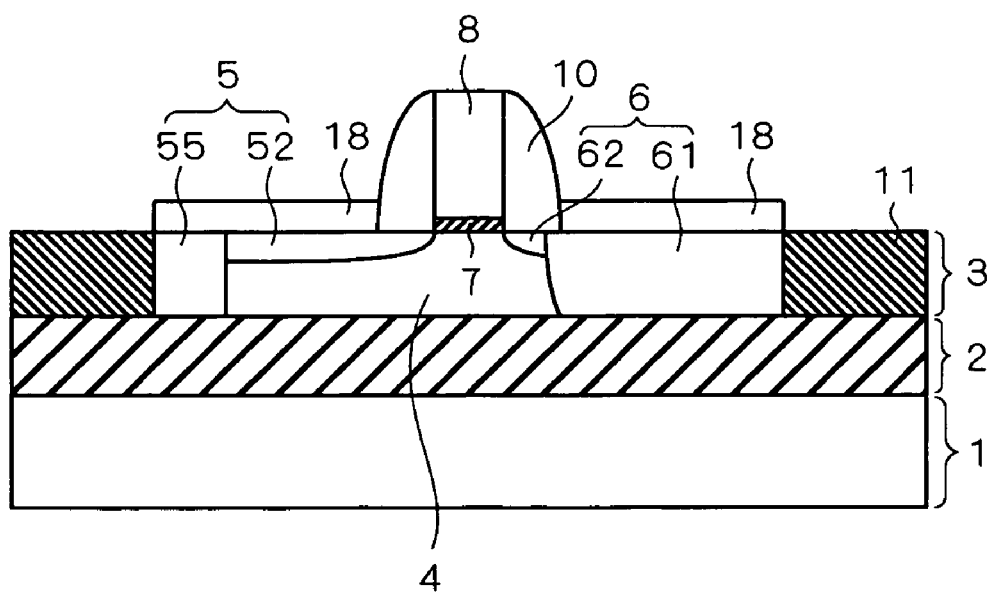
FIG. 12 is a sectional view of the semiconductor device according to the fifth embodiment of the present invention.

By photolithography or the like, N-type impurities are implanted only in the drain region by ion implantation method, and a deep drain diffusion layer 61 is formed (not shown). In a part of the source region, P-type impurities are implanted by an ion implantation method, and a P-type diffusion layer 55 is formed (not shown). Further, the cap oxide film 19 on the gate polysilicon 8 is removed. FIG. 12 is a sectional view of the semiconductor device after removal of the cap oxide film 19.

A Co film is deposited on the semiconductor device shown in FIG. 12 by a sputtering method, and is annealed. By this process, the epitaxial growth layer 18 is silicided, so that Co silicide layers 51 and 63 are formed, and part of the gate polysilicon 8 is silicided, so that a Co silicide layer 9 is formed. Depending on the annealing condition, part of the epitaxial growth layer 18 may not be silicided and left over, or part of the source extension layer 52 or the drain extension layer 62 may be silicided, so that the Co silicide layers 51 and 63 may be formed. However, the portion not exposing silicon (for example, element separation oxide film 11) does not react with a Co film, and by removing the corresponding portion, the semiconductor device shown in FIG. 10 can be formed.

Thus, in the semiconductor device according to this embodiment, since the entirety or majority of the Co silicide layer 51 is formed on the semiconductor layer 3, the contact area of the Co silicide layer 51 and the source extension layer 52 increases, and the parasitic resistance to turn-on current of a transistor can be suppressed. The semiconductor device according to this embodiment has a P-type diffusion layer 55, and the Co silicide layer 51 makes contact with the body region 4; therefore, the body potential can be fixed at the source potential, and the body floating effect can be suppressed. The Co silicide layer 51 according to this embodiment can be manufactured easily by siliciding and forming the silicon epitaxially grown selectively on the source extension layer 52.

In the semiconductor device according to this embodiment, the asymmetrical source-drain structure described in the second embodiment may be also applied. In this embodiment, Co silicide layers 9, 51, 63 are formed, but not limited thereto in the present invention. Ni silicide layers and silicide layers of other material than Co may be also formed. Further in this embodiment, the drain diffusion layer 61 is formed after forming the epitaxial growth layer 18, but the drain diffusion layer 61 may be formed before forming the epitaxial growth layer 18. In this embodiment, the silicon layer is formed by epitaxial growth on the semiconductor layer 3, but not limited thereto in the present invention. A silicon layer may be formed on the semiconductor layer 3 by another method.

Sixth Embodiment

Figure 13:
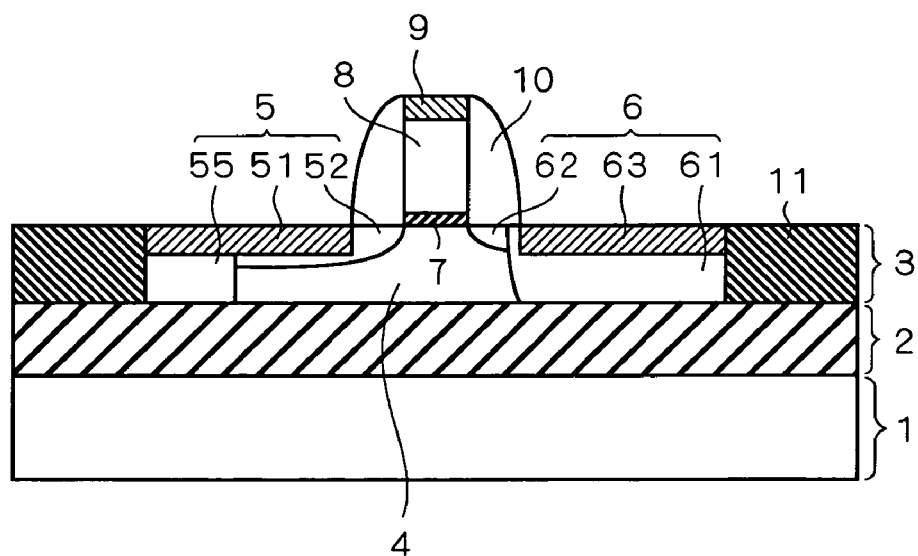
FIG. 13 is a sectional view of a semiconductor device according to a sixth embodiment of the present invention.

In a sixth embodiment, description is given of a manufacturing method of a diffusion layer such as the P-type diffusion layer 55 connecting between the Co silicide layer 51 and the body region 4 as described in the fifth embodiment. The following description relates to a manufacturing method of a P-type diffusion layer 55 by using a general configuration of a semiconductor device shown in FIG. 13. Different from the semiconductor device shown in FIG. 10, a Co silicide layer 5 is formed in a semiconductor layer 3 in the semiconductor device shown in FIG. 13. In FIG. 13, same parts as in FIG. 10 are denoted by same reference numerals, and detailed description will not be given herein.

Figure 14:
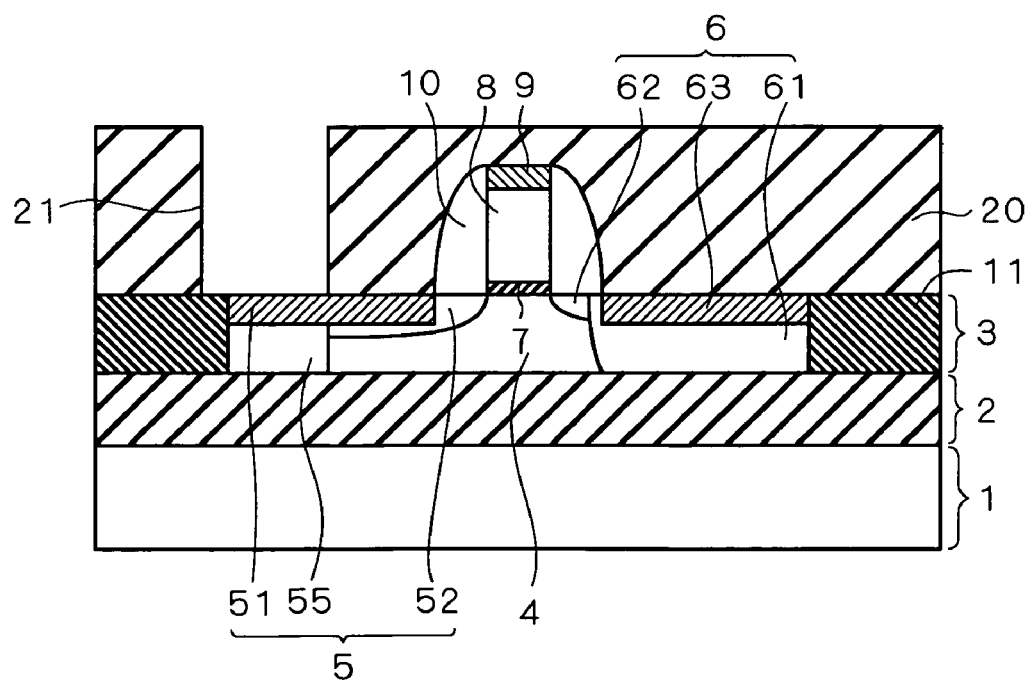
FIG. 14 is a sectional view of the semiconductor device according to the sixth embodiment of the present invention.

First, other parts than the P-type diffusion layer 55 shown in FIG. 13 are formed in the manufacturing method described in the foregoing embodiments. Then, as shown in FIG. 14, an interlayer insulating film 20 is formed on the semiconductor layer 3. A contact hole 21 is formed in the interlayer insulating film 20 with the use of photolithography, in order to provide a plug for connecting a source region 5 and a wiring formed on the interlayer insulating film 20. The interlayer insulating film 20 having the contact hole 21 formed therein is used as a mask, and boron as P-type impurities is implanted in the semiconductor layer 3, so that a P-type diffusion layer 55 is formed. That is, in this embodiment, a dedicated mask for forming the P-type diffusion layer 55 is not needed, and the interlayer insulating film 20 having the contact hole 21 formed therein is used as a mask, and the number of processes may be reduced.

As shown in FIG. 14, using the interlayer insulating film 20 having the contact hole 21 formed therein as a mask, boron ions are implanted; therefore, the P-type diffusion layer 55 is formed immediately beneath the contact hole 21. Boron as P-type impurities is implanted in the semiconductor layer 3 by an ion implantation method, and the impurity concentration of boron ions to be implanted is about, for example, $10^{14}$ ions/cm$^2$.

Figure 15:
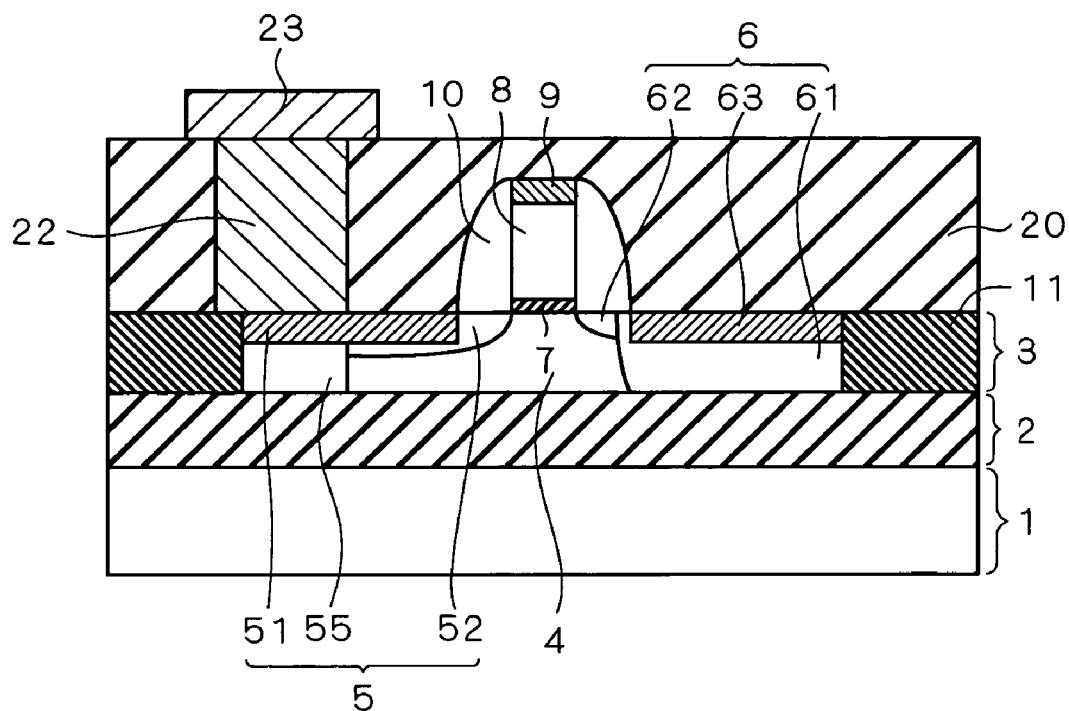
FIG. 15 is a sectional view of the semiconductor device according to the sixth embodiment of the present invention.

Further, a plug 22 is formed by filling the contact hole 21 with a conductive material (for example, tungsten) by a sputtering method or the like. After forming the plug 22, a copper wiring 23 is formed on the interlayer insulating film 20. As a result, the source region 5 is electrically connected to the copper wiring 23 via the plug 22. FIG. 15 is a sectional view of the semiconductor device having the plug 22 and the copper wiring 23 formed therein.

Thus, in the manufacturing method of the semiconductor device according to this embodiment, since the P-type diffusion layer 55 is formed by using the interlayer insulating film 20 having the contact hole 21 formed therein, the number of processes can be reduced, and the manufacturing cost is cut. In this embodiment, the contact hole is formed only at the source side, but it may be formed simultaneously at the drain side. When a hole is formed at the drain side, boron is also implanted to the drain side hole, but it is not inverted to a P-type since arsenic of high concentration has been already implanted.

In the first to sixth embodiments, the N-type channel MOSFET is described, but the present invention can be similarly applied to the P-type channel MOSFET. As the silicide, CoSi is used, but NiSi or TiSi can be used similarly.

Seventh Embodiment

In the semiconductor device shown in the foregoing embodiments, the body potential is fixed at the source potential by connecting the body region 4 to the source region 5 in some manner or other. Accordingly, the MOSFET (Metal Oxide Semiconductor Field Effect Transistor) having the configuration of the semiconductor device in the above embodiments can be applied to inverter circuit portions used with the source side fixed always, but cannot be applied to pass-transistor circuit portions in which the source side and drain side are inverted depending on the operating situation.

Figure 16:
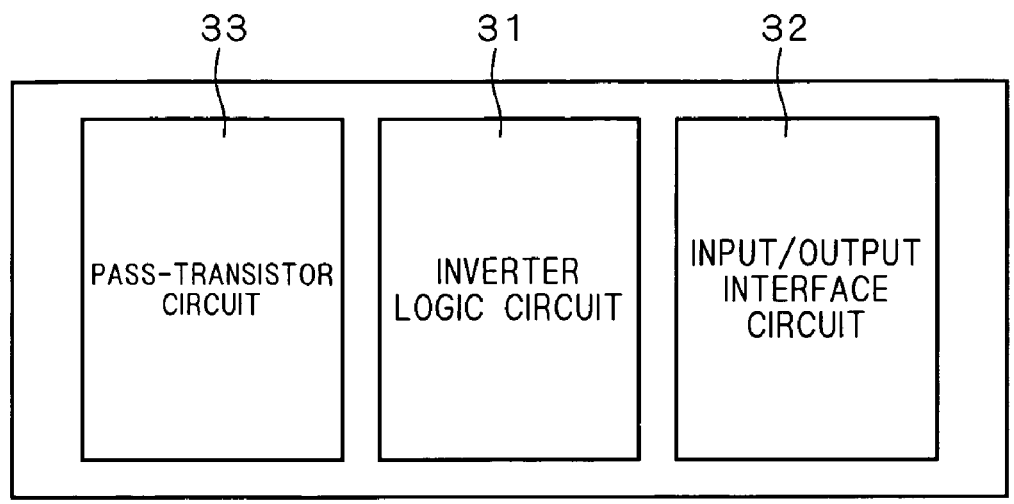
FIG. 16 is a plan view of a semiconductor circuit according to a seventh embodiment of the present invention.

In a seventh embodiment, for example as shown in FIG. 16, in portions of an inverter logic circuit 31 and an input/output interface circuit 32, since a source side is always fixed during use. In a portion of a pass-transistor circuit 33 having the configuration of any one of the semiconductor devices according to the first to sixth embodiments, the source side and drain side are inverted depending on the operating situation; therefore, an ordinary configuration of a semiconductor device is employed. In semiconductor circuits of various configurations, the configuration of the semiconductor device according to this embodiment can be applied, and the body floating effect can be suppressed appropriately.

Figure 17:
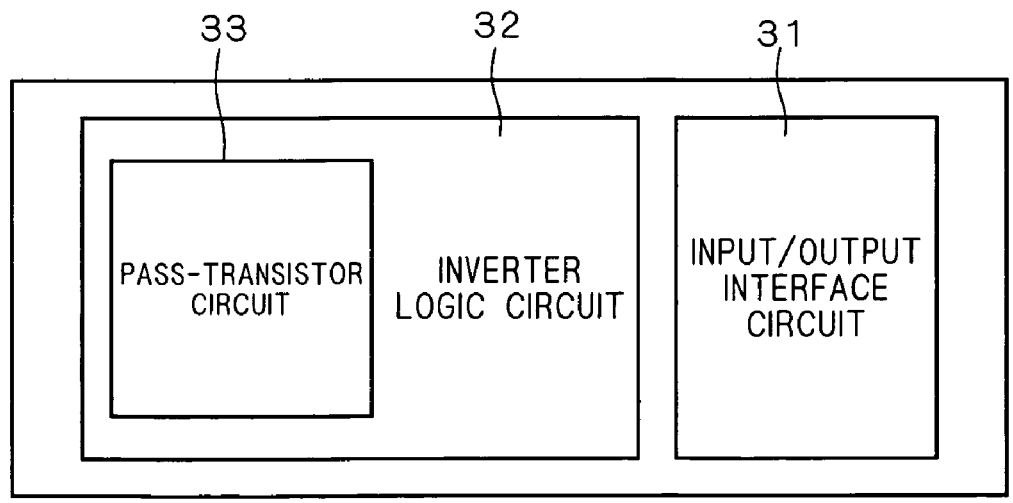
FIG. 17 is a plan view of the semiconductor circuit according to the seventh embodiment of the present invention.

In FIG. 17, in a semiconductor circuit including the inverter logic circuit 31 and the input/output interface circuit 32, part of the pass-transistor circuit 33 is formed in part of the inverter logic circuit 31. Accordingly, the ordinary structure of the semiconductor device is applied in the portion of the pass-transistor circuit 33, and the structure of the semiconductor device according to this embodiment is applied in other portions.

In this embodiment, therefore, in semiconductor circuits of various configurations, the structure of the semiconductor device according to this embodiment can be applied, and the body floating effect can be suppressed in the corresponding portion.

Eighth Embodiment

The aforementioned embodiments relate to the structure of the semiconductor device capable of fixing the body potential. In an eighth embodiment, the conventional structure of fixing the body potential by a source-tie structure is described in comparison with the structure of the present invention.

Figure 18:
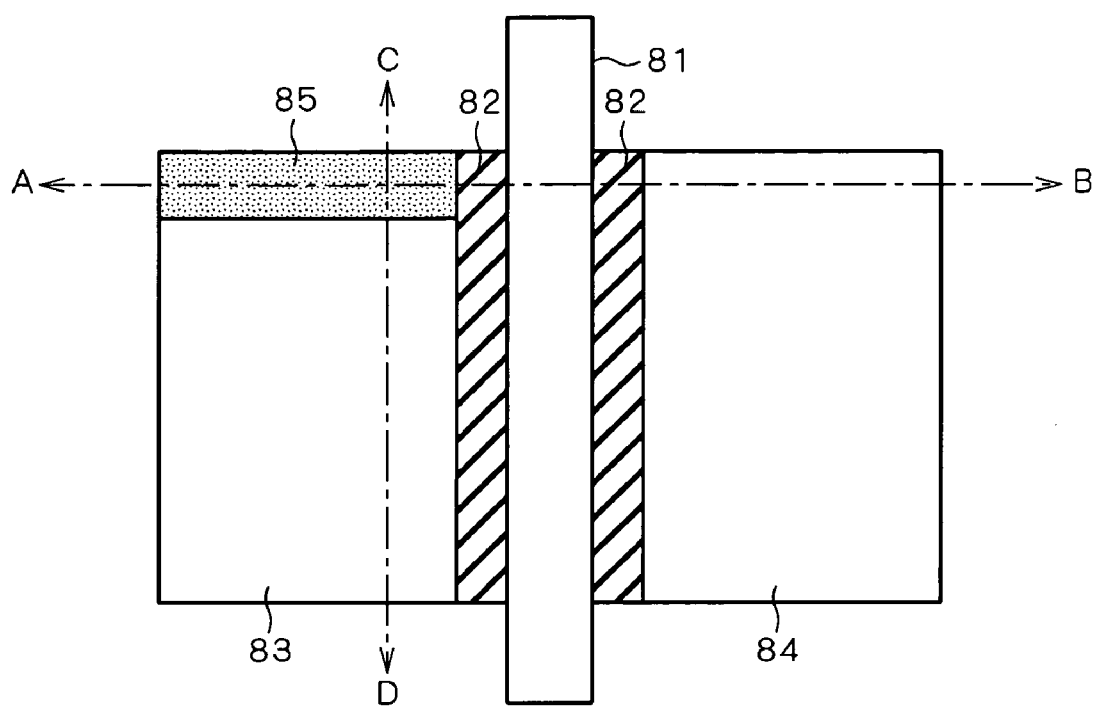
FIG. 18 is a plan view of a MOSFET using a source-tie structure according to an eighth embodiment of the present invention.

In a MOSFET having an SOI structure, a source-tie structure is described as a conventional method of fixing the body potential. FIG. 18 is a plan view of the MOSFET having the source-tie structure. The MOSFET shown in FIG. 18 is of an N type, and spacers 82 are provided at both sides of a gate electrode 81, and an N-type source 83 and an N-type drain 84 are provided further at the both sides. Further, in the MOSFET shown in FIG. 18, a P-type source-tie region 85 is provided at the formation side of the N-type source 83 so as to make contact with the N-type source 83. In the plan view of the MOSFET shown in FIG. 18, a cobalt silicide layer formed on the N-type source 83 and the N-type drain 84 is removed.

Figure 19:
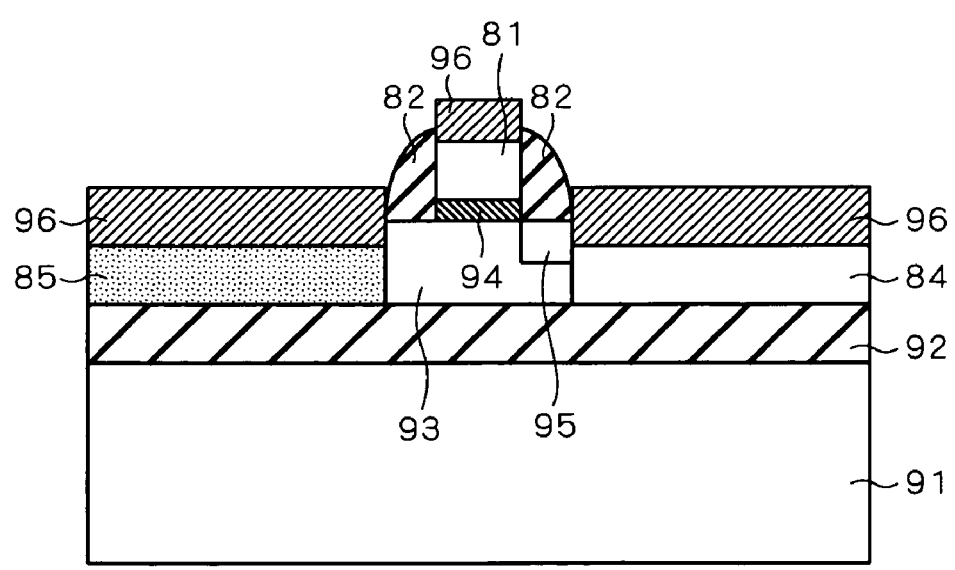
FIG. 19 is a sectional view of the MOSFET using the source-tie structure according to the eighth embodiment of the present invention.

FIG. 19 is a sectional view of the MOSFET, taken along line A-B of FIG. 18. In the MOSFET shown in FIG. 19, a buried oxide film 92 is formed on an Si substrate 91, and a body 93 including the N-type drain 84, the P-type source-tie region 85 and a P-type thin film Si layer is provided further thereon. Also in the MOSFET shown in FIG. 19, a gate electrode 81 is provided on the body 93 via a gate insulating layer 94, and at both sides of the gate electrode 81, the spacer 82 and an N-type extension 95 which makes contact with a side face of the N-type drain 84 are provided. Moreover, in the MOSFET shown in FIG. 19, a cobalt silicide layer 96 is provided on the N-type drain 84, the P-type source-tie region 85 and the gate electrode 81.

Figure 20:
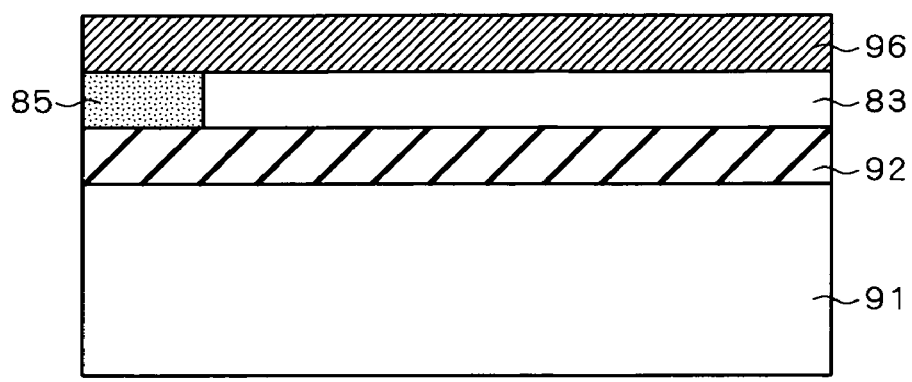
FIG. 20 is a sectional view of the MOSFET using the source-tie structure according to the eighth embodiment of the present invention.

In the MOSFET shown in FIG. 19, the P-type source-tie region 85 is provided in part of the source region so as to make contact with the body region 93 at its side face. As a result, the P-type body 93 is at same potential as the source-tie region 85. FIG. 20 is a sectional view of the MOSFET, taken along line C-D of FIG. 18.

As shown in FIG. 20, on the N-type source 83 and the P-type source-tie region 85, a cobalt silicide layer 96 is usually formed in order to decrease the resistance. Accordingly, in the source region (the formation region of the N-type source 83 and the P-type source-tie region 85), by the cobalt silicide layer 96 formed on both the P-type source-tie region 85 and the N-type source 83, the P-type source-tie region 85 and the N-type source 83 are same in potential.

Therefore, in the MOSFET having the source-tie structure shown in FIGS. 18 to 20, the body potential and the source potential can be set at same potential.

This source-tie structure may have the N-type source 83 and the N-type drain 84 formed in same impurity diffusion layer except for the P-type source-tie region 85, and the N-type source 83 and the N-type drain 84 can be formed simultaneously. Accordingly, as compared with the structure of the semiconductor device described in the foregoing embodiments, the source-tie structure can be simplified in the manufacturing process.

In the case of the source-tie structure, however, since the P-type source-tie region 85 is provided in the plane direction as shown in FIG. 18, as compared with all source regions formed in the N-type source 83, the channel width allowing to flow driving current of an FET is narrower by the portion of width of the P-type source-tie region 85. To the contrary, in the structure of semiconductor device in any of the first to fifth embodiments, the P-type source-tie region 85 is not needed, and the body potential can be fixed without narrowing the channel width.

Ninth Embodiment

In a ninth embodiment, the structure of the semiconductor device shown in any of the first to sixth embodiments is applied to an SRAM (Static Random Access Memory) circuit.

In the SRAM using the semiconductor device having the SOI structure, when the body potential is not fixed, but is floating, a threshold Vth varies depending on the change of a body potential by a circuit operation. Hence, in the SRAM using the semiconductor device having the SOI structure, the operation thereof tends to be unstable when reading or writing data.

Figure 21:
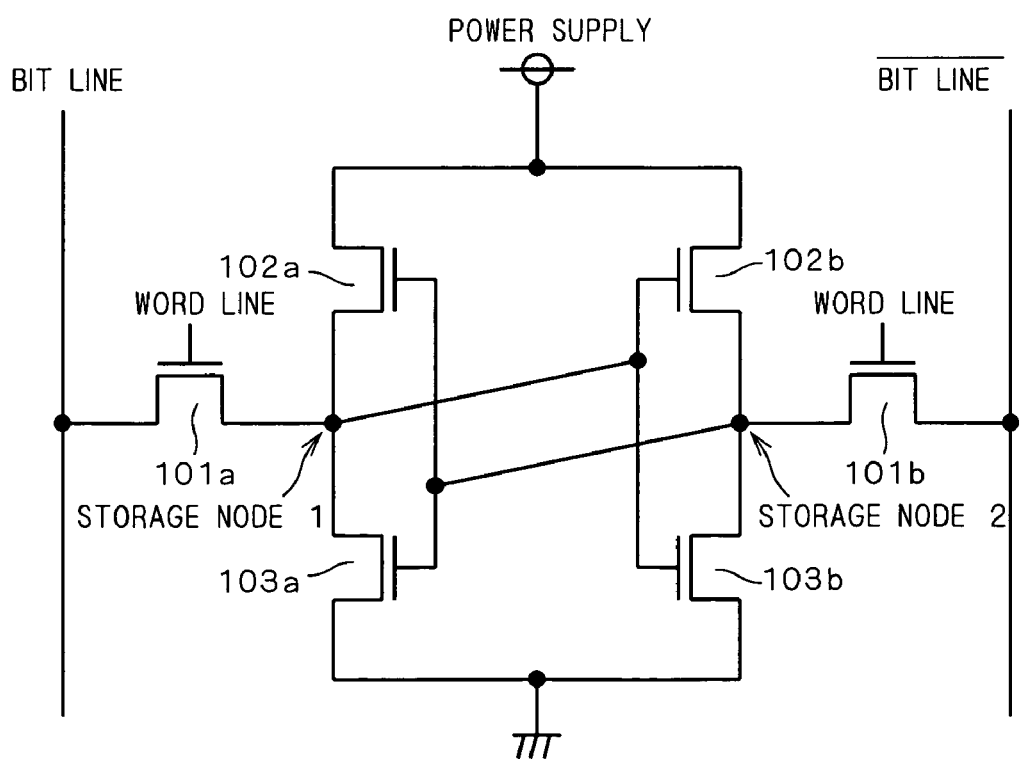
FIG. 21 is a circuit diagram of an SRAM according to a ninth embodiment of the present invention.

Accordingly, in the SRAM according to this embodiment, by applying the structure of the semiconductor device capable of fixing the body potential at the source potential described in the first to sixth embodiments, the above problem is solved. Specifically, FIG. 21 shows how to apply the semiconductor device described in any of the first to sixth embodiments. FIG.

21 is a circuit diagram of one memory cell in the SRAM according to this embodiment.

The memory cell of the SRAM shown in FIG. 21 includes an access transistor 101a connected between a bit line and a storage node 1, an access transistor 101b connected between the bit line and a storage node 2, a load transistor 102a connected between a power supply and the storage node 1, a load transistor 102b connected between the power source and the storage node 2, a driver transistor 103a connected between a GND and the storage node 1, and a driver transistor 103b connected between the GND and the storage node 2. A word line is connected to gate electrodes of the access transistors 101a and 101b.

In the SRAM according to this embodiment, the structure of the semiconductor device according to any of the first to sixth embodiments is applied to the load transistors 102a and 102b and the driver transistors 103a and 103b, out of the transistors shown in FIG. 21. However, in the access transistors 101a and 101b, since the source and drain are exchanged depending on the operating situation, the structure of the semiconductor device described in any of the first to sixth embodiments cannot be applied, and it is used in a body floating state. That is, in the SRAM according to this embodiment, the structure of the semiconductor device described in any of the first to sixth embodiments is applied to the load transistors 102a and 102b and the driver transistors 103a and 103b in which the source side is determined in the operating situation.

Therefore, in the SRAM according to this embodiment, the structure of the semiconductor device described in any of the first to sixth embodiments is applied to the load transistors 102a and 102b and the driver transistors 103a and 103b, but not applied in pass-transistors, that is, the access transistors 101 and 101b. Hence, the body potentials of the load transistors 102a and 102b and the driver transistors 103a and 103b are fixed, and the operation of the SRAM is stable when reading or writing data.

Tenth Embodiment

In the ninth embodiment, the structure of the semiconductor device described in any of the first to sixth embodiments is applied only to the load transistors 102a and 102b and the driver transistors 103a and 103b constituting the SRAM, whereas the access transistors 101a and 101b are formed in the body floating structure.

However, if only the access transistors 101a and 101b are in the body floating structure, since the threshold Vth varies depending on the circuit operation, the operation margin of the SRAM may be narrowed.

Figure 22:
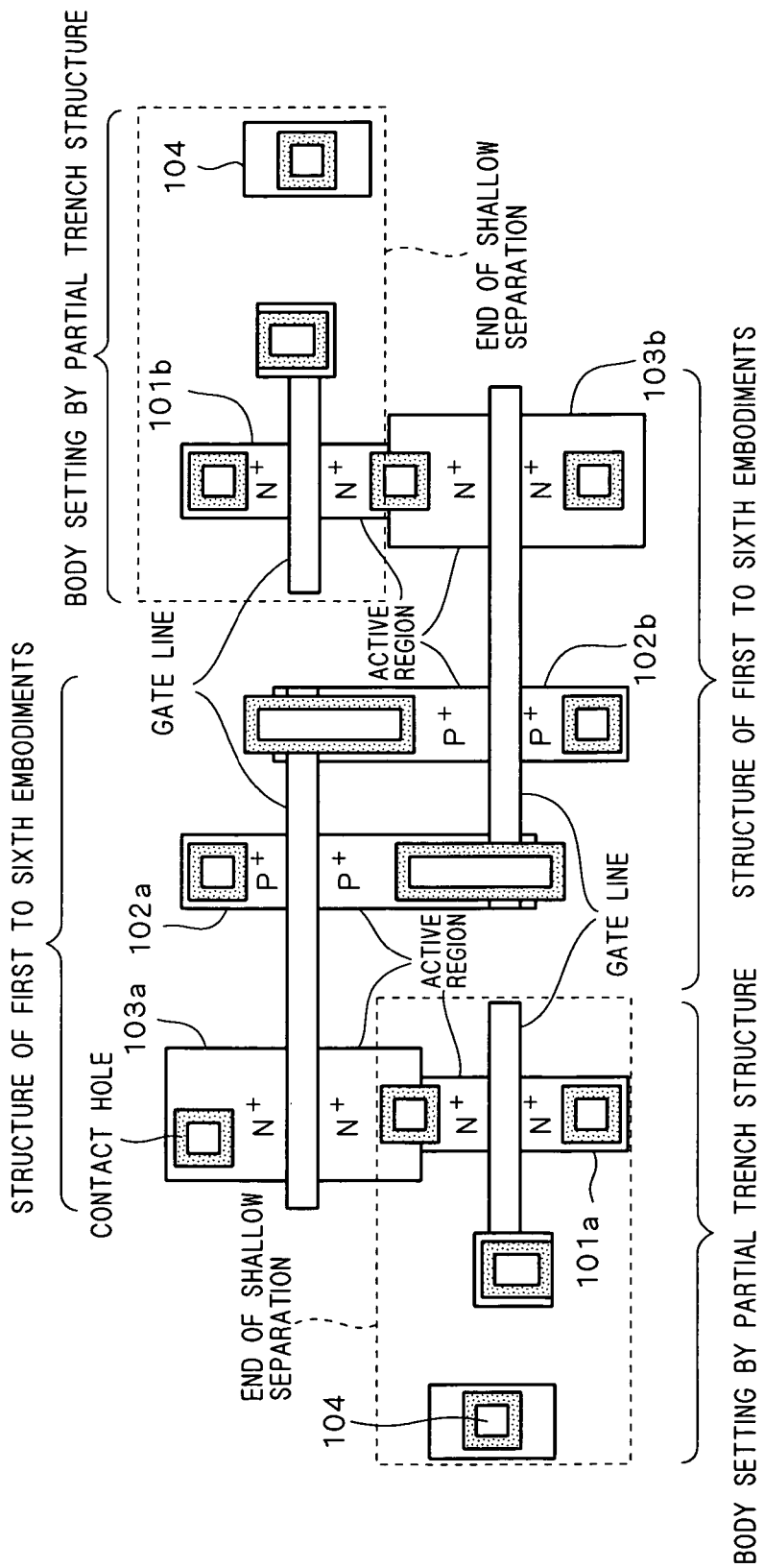
FIG. 22 is a plan view of an SRAM according to a tenth embodiment of the present invention.

Therefore, in an SRAM according to a tenth embodiment, the body potential fixing structure described in the first to sixth embodiments is applied to load transistors 102a and 102b and driver transistors 103a and 103b, while another body potential fixing structure is applied to access transistors 101a and 101b. FIG. 22 is a plan view of the SRAM according to this embodiment. In the SRAM shown in FIG. 22, the structure described in the first to sixth embodiments is applied to the load transistors 102a and 102b and the driver transistors 103a and 103b, and a partial trench separation structure is applied to the access transistors 101a and 101b, so that the body potential is fixed. In the case of the partial trench separation structure shown in FIG. 22, the access transistors 101a and 101b and a body terminal 104 are at the same potential. In FIG. 22, in order to indicate a shallow region of a separation oxide film, end of shallow separation is shown by a broken line.

Figure 23:
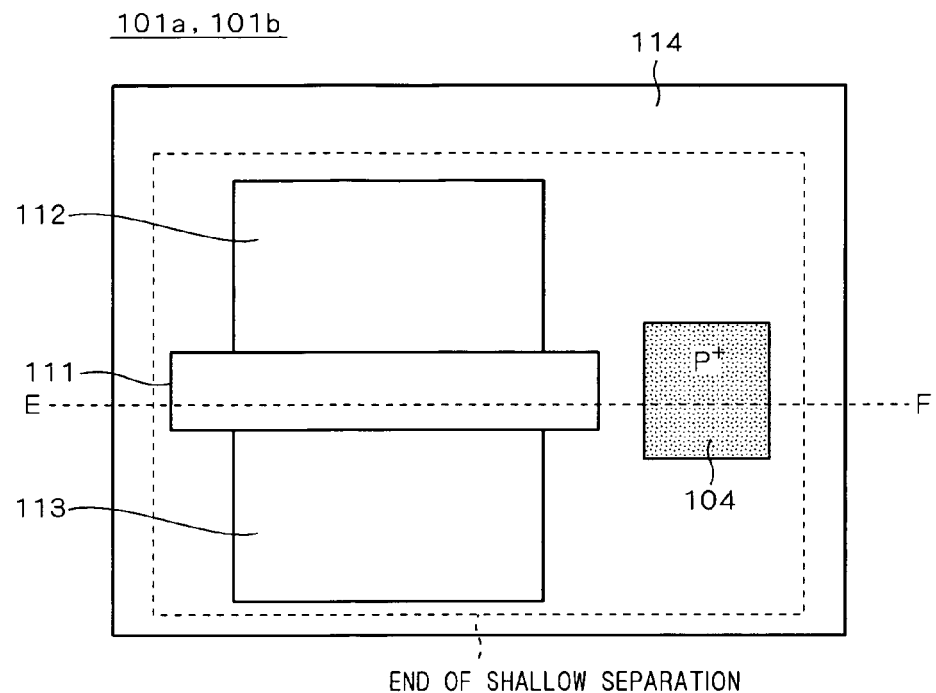
FIG. 23 is a plan view of a partial trench separation structure according to the tenth embodiment of the present invention.

The partial trench separation structure used in the access transistors 101a and 101b is described. FIG. 23 is a plan view of a specific partial trench separation structure. In FIG. 23, an N-type source region 112 and an N-type drain region 113 are shown at both sides of a gate electrode 111 constituting the access transistors 101a and 101b. FIG. 23 further shows the body terminal 104 separated from the access transistors 101a and 101b by a separation oxide film 114. In FIG. 23, since the partial trench separation structure is employed, the inside of the end of shallow separation indicated by a broken line is a shallow region of the separation oxide film 114.

Figure 24:
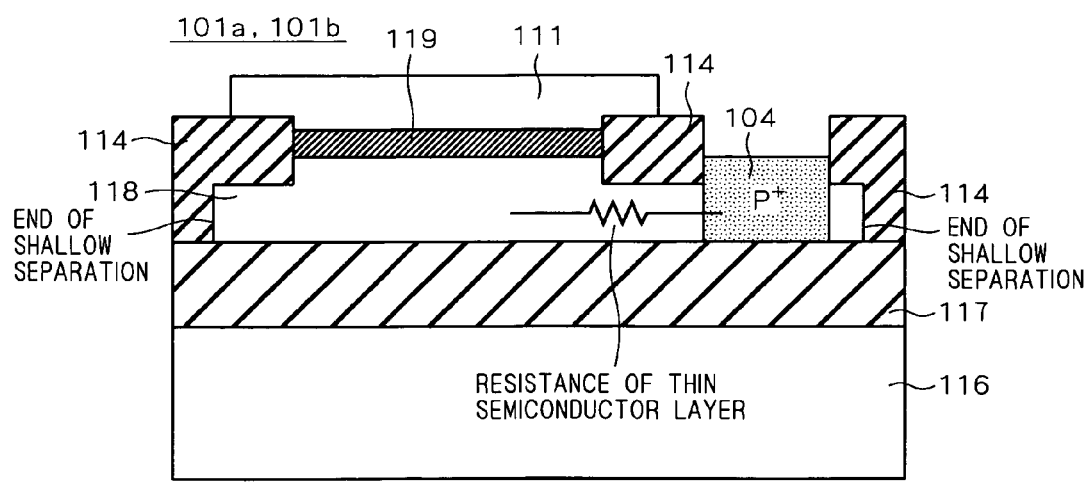
FIG. 24 is a sectional view of the partial trench separation structure according to the tenth embodiment of the present invention.

FIG. 24 is a sectional view taken along line E-F of FIG. 23. As shown in FIG. 24, since the access transistors 101a and 101b according to this embodiment are of an SOI structure, they are formed on a buried oxide film 117. A lower layer of the buried oxide film 117 is a Si substrate 116. In the access transistors 101a and 101b shown in FIG. 24, a P-type body 118 and the body terminal 104 are separated by the separation oxide film 114. However, the access transistors 101a and 101b and the body terminal 104 are in an inside region from the end of shallow separation, and the separation oxide film 114 in this region is shallow, and is not formed up to the buried oxide film 117. Therefore, the P-type body 118 and the body terminal 104 are electrically connected to each other in the lower layer of the separation oxide film 114. A gate insulating film 119 is formed on the P-type body 118, and a gate electrode 111 is formed on the gate insulating film 119.

Therefore, the access transistors 101a and 101b according to this embodiment can be fixed in body potential by employing the partial trench separation structure shown in FIGS. 23 and 24. The body terminal 104 is higher in P-type impurity concentration than the P-type body 118. As a result, the SRAM according to this embodiment is stable in threshold Vth of the access transistors 101a and 101b, being free from influence of the circuit operation, and the operation margin of the SRAM can be assured when reading or writing data.

As for the load transistors 102a and 102b and the driver transistors 103a and 103b, it may be considered to fix the body potential by employing the partial trench separation structure. However, when the partial trench separation structure is employed, since the body potential is fixed via a thin semiconductor layer beneath the partial trench separation film, as shown in FIG. 24, resistance of thin semiconductor layer exists between the body terminal 104 and the body 118. Accordingly, the partial trench separation structure may have problems of increase of resistance in the pertinent area and lowering of fixing capability of body potential when the distance of a portion of a thin semiconductor layer is long.

Therefore, in the SRAM according to this embodiment, the transistor employing the partial trench separation structure is limited to the access transistors 101a and 101b only, and the structure of semiconductor device described in any of the first to sixth embodiments is applied to the load transistors 102a and 102b and driver transistors 103a and 103b, so that the operation of the SRAM can be further stable when reading or writing data.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having an SOI structure, comprising:
    a silicon substrate;
    a buried insulating layer which is formed on said silicon substrate; and a semiconductor layer which is formed on said buried insulating layer, wherein said semiconductor layer includes a body region of a first conduction type, a source region of a second conduction type and a drain region of the second conduction type, a gate electrode is formed on said body region between said source region and said drain region via a gate oxide film, said source region includes an extension layer of the second conduction type, said semiconductor layer being between the bottom surface of said extension layer and said buried insulating layer, and a silicide layer on top of said extension layer wherein the upper surface of said silicide layer is higher than the upper surface of said gate oxide film and the bottom surface of said silicide layer is higher than the upper surface of said body region between said source region and said drain region, said silicide layer is electrically connected to said body region via a diffusion layer of the first conduction type formed in said semiconductor layer, the diffusion layer extending entirely from one end of said source region to another end in a channel width direction, said drain region includes a drain diffusion region in contact with said buried insulating layer, and an extension layer of the second conduction type arranged not to reach said buried insulating layer, and said first conduction type and said second conduction type are different from each other.

2. The semiconductor device of claim 1, wherein said extension layer is higher in effective concentration of impurities of the second conduction type as compared with an extension layer formed on said drain region.

3. A memory circuit comprising:

an access transistor which is connected between a bit line and a storage node;

a load transistor which is connected between a power supply and said storage node; and a driver transistor which is connected between a GND and said storage node, wherein each of said load transistor and said driver has the semiconductor structure as recited in claim 1.

* * * * *